US010732691B2

(12) United States Patent
Boyden et al.

(10) Patent No.: US 10,732,691 B2
(45) Date of Patent: Aug. 4, 2020

(54) APPARATUS, SYSTEMS AND METHODS FOR DETECTING ELECTRICAL FAILURES WITHIN COMPUTING DEVICES

(71) Applicant: Juniper Networks, Inc., Sunnyvale, CA (US)

(72) Inventors: Franklin D. Boyden, Pleasanton, CA (US); David K. Owen, Livermore, CA (US); Anupama Padminidevi Karthikeyan Nair, San Jose, CA (US); Jaspal S. Gill, Tracy, CA (US); Katsuhiro Okamura, Royal Oaks, CA (US); Michael D. Savini, San Jose, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 159 days.

(21) Appl. No.: 16/118,624

(22) Filed: Aug. 31, 2018

(65) Prior Publication Data
US 2020/0073458 A1 Mar. 5, 2020

(51) Int. Cl.
*G06F 1/30* (2006.01)
*G06F 1/28* (2006.01)
*G01R 31/50* (2020.01)

(52) U.S. Cl.
CPC .............. *G06F 1/305* (2013.01); *G01R 31/50* (2020.01); *G06F 1/28* (2013.01)

(58) Field of Classification Search
CPC ............ G01R 31/50; G06F 1/28; G06F 1/305
See application file for complete search history.

(56) References Cited

U.S. PATENT DOCUMENTS

| 2004/0158771 | A1* | 8/2004 | Garnett | G06F 1/263 714/14 |
| 2005/0015531 | A1* | 1/2005 | Yabuta | G06F 13/4027 710/100 |
| 2009/0119523 | A1* | 5/2009 | Totten | G06F 1/26 713/322 |

(Continued)

OTHER PUBLICATIONS

Short Circuit; https://en.wikipedia.org/wiki/Short_circuit (Aug. 1, 2004).

(Continued)

*Primary Examiner* — Terrell S Johnson
(74) *Attorney, Agent, or Firm* — FisherBroyles, LLP

(57) ABSTRACT

The disclosed method may include (1) monitoring, while a computing device receives power from an external power supply, (A) the amount of power consumed by the computing device and (B) the amount of power provided to the computing device by the external power supply, (2) detecting that the amount of power provided to the computing device exceeds the amount of power consumed by the computing device by at least a certain threshold, (3) determining, based on the amount of power provided to the computing device exceeding the amount of power consumed by the computing device by the certain threshold, that the computing device is experiencing a malfunction, and then (4) mitigating potential damage to the computing device due to the malfunction by at least partially reducing the amount of power provided to the computing device from the external power supply. Various other apparatuses, systems, and methods are disclosed.

20 Claims, 8 Drawing Sheets

(56) References Cited

U.S. PATENT DOCUMENTS

2016/0316438 A1* 10/2016 Stewart ................ H04W 72/10

OTHER PUBLICATIONS

Jimmy Chun-Chuen Leung, et al.; Apparatus, System, and Method for Preventing Demate Between Field-Replaceable Units and Telecommunications Systems; U.S. Appl. No. 15/640,492, filed Jul. 1, 2018.

Sreekanth Rupavatharam, et al.; Apparatus, System, and Method for Efficiently Filtering Packets at Network Devices; U.S. Appl. No. 15/938,857, filed Mar. 28, 2018.

* cited by examiner

APPARATUS, SYSTEMS AND METHODS FOR DETECTING ELECTRICAL FAILURES WITHIN COMPUTING DEVICES

BACKGROUND

Low-impedance shorts (also known as "short circuits" or "electric shorts") within computing devices may cause significant damage to or even failure of those devices. For example, a short circuit may cause unexpectedly high amounts of power and/or current to flow between two or more components of a device, thereby dangerously increasing the operating temperature of those components. As the amount of power provided to a device increases, so too does the risk of damage to the device due to electrical failures. Devices connected to midplanes or other power-distribution mechanisms that carry large current loads may be especially harmed by short circuits.

Thus, manufacturers of power supplies and/or devices that utilize power supplies often attempt to protect these devices from damage caused by short circuits. Specifically, a device manufacturer may implement a software- and/or hardware-based system within a device that attempts to detect the onset of a short circuit or similar failure. Unfortunately, traditional systems for detecting these failures may be unable to identify a short circuit before significant damage occurs within a device. Moreover, such a system may be rendered useless if a short circuit damages the system itself.

The instant disclosure, therefore, identifies and addresses a need for improved apparatuses, systems, and methods for detecting electrical failures within computing devices.

SUMMARY

As will be described in greater detail below, the instant disclosure generally relates to apparatuses, systems, and methods for detecting electrical failures within computing devices. In one example, a method for accomplishing such a task may include (1) monitoring, while a computing device receives power from an external power supply, (A) the amount of power consumed by the computing device and (B) the amount of power provided to the computing device by the external power supply, (2) detecting that the amount of power provided to the computing device exceeds the amount of power consumed by the computing device by at least a certain threshold, (3) determining, based at least in part on the amount of power provided to the computing device exceeding the amount of power consumed by the computing device by the certain threshold, that the computing device is experiencing a malfunction, and then (4) mitigating potential damage to the computing device due to the malfunction by at least partially reducing the amount of power provided to the computing device from the external power supply.

Similarly, a system for implementing the above-described method may include various modules stored in memory. This system may also include at least one hardware processor that executes these modules. For example, the system may include (1) a monitoring module that monitors, while a computing device receives power from an external power supply, (A) the amount of power consumed by the computing device and (B) the amount of power provided to the computing device by the external power supply, (2) a detection module that detects that the amount of power provided to the computing device exceeds the amount of power consumed by the computing device by at least a certain threshold, (3) a determination module that determines, based at least in part on the amount of power provided to the computing device exceeding the amount of power consumed by the computing device by the certain threshold, that the computing device is experiencing a malfunction, and (4) a reducing module that mitigates potential damage to the computing device due to the malfunction by at least partially reducing the amount of power provided to the computing device from the external power supply.

As another example, a power-monitoring apparatus for implementing the above-described method may include at least one storage device that facilitates execution of the power-monitoring apparatus. In this example the power-monitoring apparatus may also include at least one physical processing device communicatively coupled to the storage device. This physical processing device may (1) monitor, while a computing device receives power from an external power supply, (A) the amount of power consumed by the computing device and (B) the amount of power provided to the computing device by the external power apply, (2) detect that the amount of power provided to the computing device exceeds the amount of power consumed by the computing device by at least a certain threshold, (3) determine, based at least in part on the amount of power provided to the computing device exceeding the amount of power consumed by the computing device by the certain threshold, that the computing device is experiencing a malfunction, and then (4) mitigate potential damage to the computing device due to the malfunction by at least partially reducing the amount of power provided to the computing device from the external power supply.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
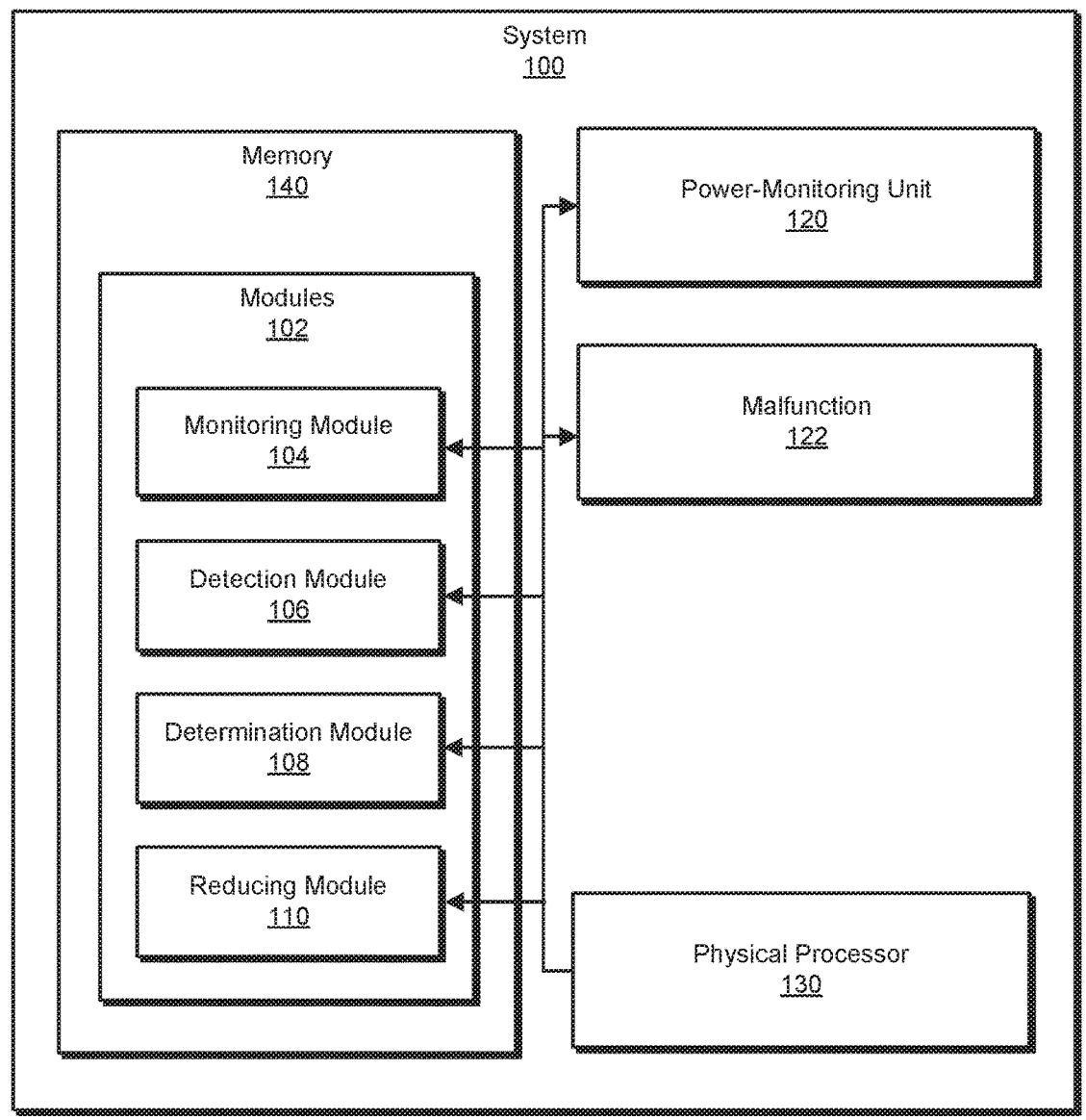
FIG. 1 is a block diagram of an exemplary system for detecting electrical failures within computing devices.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for detecting electrical failures within computing devices. As will be explained in greater detail below, the disclosed power-monitoring unit may identify a short circuit or similar malfunction within a device by detecting when the amount of power consumed by the device drops below at least certain threshold relative to the amount of power provided to the device by an external power supply. After detecting a short circuit within a device, the power-monitoring unit may prevent further damage to the device due to the short circuit by immediately discontinuing and/or preventing power flow within the device.

The disclosed power-monitoring unit may detect electrical failures within a device in a variety of ways and/or contexts. For example, the power-monitoring unit may detect a short circuit within a device connected to a power supply via a midplane by monitoring power provided to and drawn from the midplane. In addition, the power-monitoring unit may monitor the power consumption of a device by implementing a so-called watchdog timer within a power supply that provides power to the device. If the power-monitoring unit does not receive a signal from the device indicating normal operation of the device during the timer's countdown, the power-monitoring unit may conclude that the device is experiencing a short circuit that has damaged all or a portion of the device's software. Accordingly, the disclosed apparatuses, systems, and methods may provide multiple ways to accurately and efficiently detect electrical failures within devices, thereby preventing and/or reducing damage to the devices due to these failures.

Figure 2:
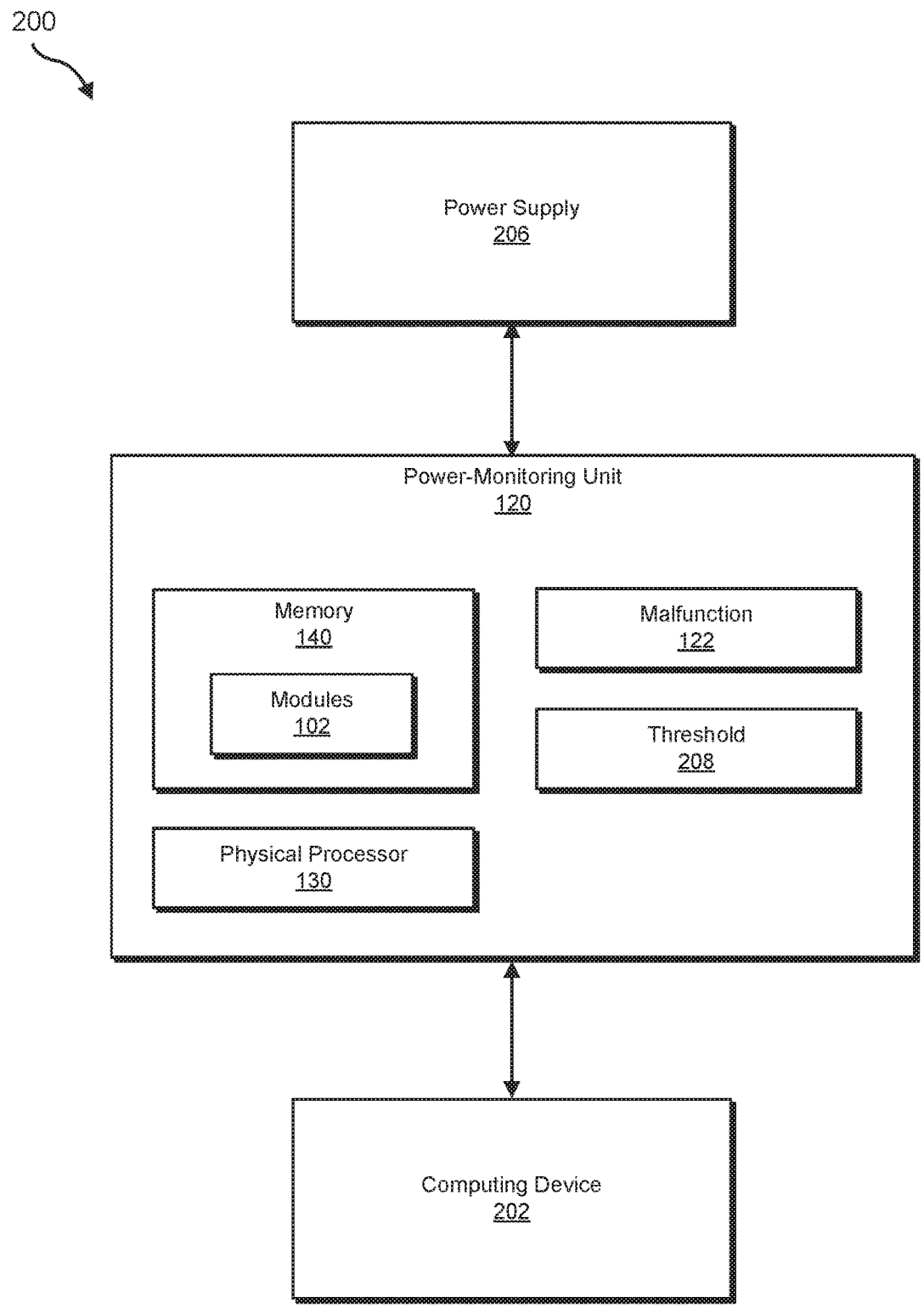
FIG. 2 is a block diagram of an additional exemplary system for detecting electrical failures within computing devices.

The following will provide, with reference to FIGS. 1 and 2, detailed descriptions of exemplary systems for detecting electrical failures within computing devices. Detailed descriptions of corresponding methods and implementations will be provided in connection with FIGS. 3-7. Finally, detailed descriptions of an exemplary computing system for carrying out these methods will be provided in connection with FIG. 8.

In certain embodiments, one or more of modules 102 in FIG. 1 may represent one or more software applications or programs that, when executed by a computing device, cause the computing device to perform one or more tasks. For example, and as will be described in greater detail below, one or more of modules 102 may represent modules stored and configured to run on one or more computing devices, such as the devices illustrated in FIG. 2 (e.g., computing device 202 and/or power supply 206). In addition, one or more of modules 102 may perform any of the functionality described herein in connection with any of the devices illustrated in FIG. 2. One or more of modules 102 in FIG. 1 may also represent all or portions of one or more special-purpose computers configured to perform one or more tasks.

As illustrated in FIG. 1, system 100 may also include one or more memory devices, such as memory 140. Memory 140 generally represents any type or form of volatile or non-volatile storage device or medium capable of storing data and/or computer-readable instructions. In one example, memory 140 may store, load, and/or maintain one or more of modules 102. Examples of memory 140 include, without limitation Random Access Memory (RAM), Read Only Memory (ROM), flash memory, Hard Disk Drives, (HDDs), Solid-State Drives (SSDs), optical disk drives, caches, variations or combinations of one or more of the same, and/or any other suitable storage memory.

As illustrated in FIG. 1, system 100 may also include one or more physical processors, such as physical processor 130. Physical processor 130 generally represents any type or form of hardware-implemented processing unit capable of interpreting and/or executing computer-readable instructions. In one example, physical processor 130 may access and/or modify one or more of modules 102 stored in memory 140. Additionally or alternatively physical processor 130 may execute one or more of modules 102 to facilitate detecting electrical failures within computing devices. Examples of physical processor 130 include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, and/or any other suitable physical processor.

As illustrated in FIG. 1, exemplary system 100 may also include one or more power-monitoring units, such as a power-monitoring unit 120. Power-monitoring unit 120 generally represents any type or form of software- and/or hardware-based program or module that monitors the amount of current, voltage, and/or power that is output by a power supply and/or input to a computing device. In some examples, power-monitoring unit 120 may include and/or represent a circuit and/or a sensor. In one example, power-monitoring unit 120 may be implemented within a power supply. Additionally or alternatively, power-monitoring unit 120 may be implemented within a computing device that receives power from a power supply. In further examples, power-monitoring unit 120 may be implemented within a midplane or other power-distribution mechanism that transmits power from one or more power supplies to one or more computing devices.

As will be explained in greater detail below, power-monitoring module 120 may detect a malfunction (such as a malfunction 122 illustrated in FIG. 1) within a power supply and/or computing device. The term "malfunction," as used herein, generally refers to any type or form of problem, issue, and/or failure within an electrical system of a device that may impact the performance, safety, and/or physical integrity of the device.

In one embodiment, malfunction 122 may represent and/or correspond to a short circuit. The term "short circuit" or alternatively "electric short," as used herein, generally refers to any unexpected and/or undesirable connection between two or more nodes of an electric circuit. In some examples, a short circuit may create a low-impedance connection between multiple components of a device, thereby greatly increasing the amount of current and/or power flowing between the components. If unchecked, a short circuit may cause damage to and/or failure of all or a portion of the device.

Exemplary system 100 in FIG. 1 may be implemented in a variety of ways. For example, all or a portion of exemplary system 100 may represent portions of exemplary system 200 in FIG. 2. As shown in FIG. 2, system 200 may include a computing device 202 and a power supply 206. In one example, all or a portion of the functionality of modules 102 may be performed by computing device 202 and/or power supply 206. Additionally or alternatively, all or a portion of the functionality of modules 102 may be performed by power-monitoring unit 120. As illustrated in FIG. 2, power-monitoring unit 120 may be connected to and/or in communication with computing device 202 and power supply 206. Additionally or alternatively, power-monitoring unit 120 may be implemented by and/or as part of computing device 202 and/or power supply 206. As will be described in greater detail below, one or more of modules 102 from FIG. 1 may, when executed by at least one processor of computing device 202, power supply 206, and/or power-monitoring unit 120, enable power-monitoring unit 120 to detect electrical failures within computing devices.

Computing device 202 generally represents any type or form of physical computing device designed to receive power from an external power supply. In one embodiment, computing device 202 may include and/or represent a field-replaceable unit. The term "field-replaceable unit" and its abbreviation "FRU," as used herein, generally refer to any type or form of modular device that includes one or more ports and/or interfaces that carry and/or forward traffic within a network and/or across multiple networks. Examples of FRUs include, without limitation, PICs, FPCs Switch Interface Boards (SIBs), control boards, routing engines, communication ports, fan trays, connector interface panels, routers, switches, portions of one or more of the same, combinations or variations of one or more of the same, and/or any other suitable FRU. Additional examples of computing device 202 include, without limitation, laptops, tablets, desktops, servers, cellular phones, Personal Digital Assistants (PDAs), multimedia players, embedded systems, wearable devices (e.g., smart watches, smart glasses, etc.), gaming consoles, combinations of one or more of the same, or any other suitable computing device.

Power supply 206 generally represents any type or form of software- and/or hardware-based device designed to supply power to one or more computing devices (such as computing device 202). In one embodiment, power supply 206 may represent an external (e.g., independent) power supply. For example, power supply 206 may be physically distinct and/or separate from computing device 202.

Power supply 206 may be capable of providing Alternating Current (AC) power and/or Direct Current (DC) power. In addition, power supply 206 may be capable of providing power, current, and/or voltage within any suitable range and/or limit. In one embodiment, power supply 206 may supply high-current power (e.g., power at 60 Amperes). In this embodiment, power supply 206 may supply power to one or more computing devices via a midplane or similar power-distribution mechanism.

Figure 3:
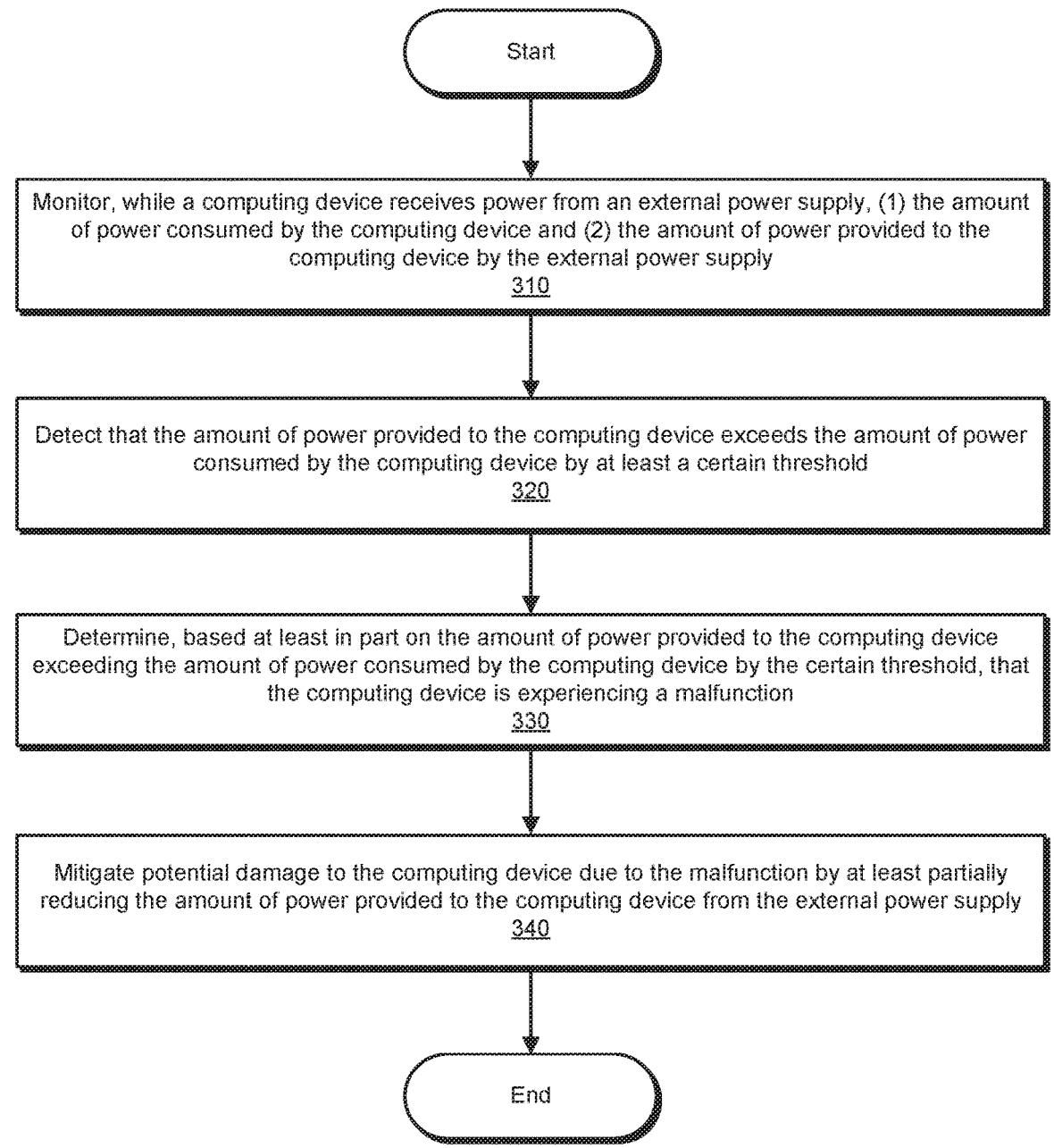
FIG. 3 is a flow diagram of an exemplary method for detecting electrical failures within computing devices.

FIG. 3 is a flow diagram of an example computer-implemented method 300 for detecting electrical failures within computing devices. The steps shown in FIG. 3 may be performed by any suitable computer-executable code and/or computing system, including system 100 in FIG. 1, system 200 in FIG. 2, implementation 400 in FIG. 4, implementation 500 in FIG. 5, and/or variations or combinations of one or more of the same. In one example, each of the steps shown in FIG. 3 may represent an algorithm whose structure includes and/or is represented by multiple sub-steps, examples of which will be provided in greater detail below.

As illustrated in FIG. 3, at step 310 one or more of the systems described herein may monitor, while a computing device receives power from an external power supply, (1) the amount of power consumed by the computing device and (2) the amount of power provided to the computing device by the external power supply. For example, while computing device 202 receives power from power supply 206, monitoring module 104 may as part of power-monitoring unit 120 in FIG. 2, monitor (1) the amount of power consumed by computing device 202 and (2) the amount of power provided to computing device 202 by power supply 206. In this example, power-monitoring unit 120 may be implemented within and/or as part of computing device 202, power supply 206, and/or any additional device connected to computing device 202 and/or power supply 206.

The systems described herein may perform step 310 in a variety of ways and/or contexts. In some examples, monitoring module 104 may determine the amount of power consumed by computing device 202 by measuring and/or calculating the amount of current and the amount of voltage input to computing device 202. Monitoring module 104 may then calculate the instantaneous amount of power input to computing device 202 based on the formula Power=Current×Voltage. Similarly, monitoring module 104 may determine the amount of power provided to computing device 202 by measuring and/or calculating the amount of current and the amount of voltage output by power supply 206. In one embodiment, computing device 202 and power supply 206 and may be equipped with software- and/or hardware-based sensors that provide these values to monitoring module 104.

In some embodiments, monitoring module 104 may determine the average amount of power consumed by and/or provided to computing device 202 during a certain time period. For example, monitoring module 104 may sample the instantaneous amount of power consumed by and/or provided to computing device 202 multiple times (e.g., 10 times) within a certain length of time (e.g., 5 seconds). Monitoring module 104 may then average these samples using any type or form of averaging formula, such as an exponential moving average or an arithmetic mean. In this way, monitoring module 104 may avoid erroneously detecting a malfunction within computing device 202 (e.g., a false positive) based on a temporary and/or benign decrease in power consumption by computing device 202.

In some examples, monitoring module 104 may periodically determine the average amount of power consumed by and provided to computing device 202. For example, monitoring module 104 may monitor these power levels as part of tests that are performed at certain time intervals (e.g., every 5 minutes) while computing device 202 is operating.

In one embodiment, monitoring module 104 may monitor various settings of computing device 202 and/or power supply 206 while performing these tests. For example, monitoring module 104 may record certain testing conditions and/or variables that may affect the amount of power consumed by computing device 202 and/or output by power supply 206, such as the operating temperature of computing device 202, the speed of fans operating within computing device 202, and/or the number of additional power supplies and/or computing devices connected to power supply 206 and computing device 202.

As mentioned above, in some examples, power-monitoring module 120 may be implemented within a midplane or similar power-distribution mechanism positioned between computing device 202 and power supply 206. The term "midplane," as used herein, generally refers to any type or form of device that receives power from at least one power supply and distributes the received power to one or more computing devices. In one embodiment, a midplane may efficiently distribute power to a large number (e.g., 5, 10, 25, etc.) of computing devices. In addition, a midplane may ensure that each computing device connected to the midplane remains operational in the event that one or more power supplies fail. However, midplanes may often transmit and/or carry large amounts of power and/or current, thereby increasing the risk of damage in the event of a short circuit within the midplane and/or connected computing devices.

Figure 4:
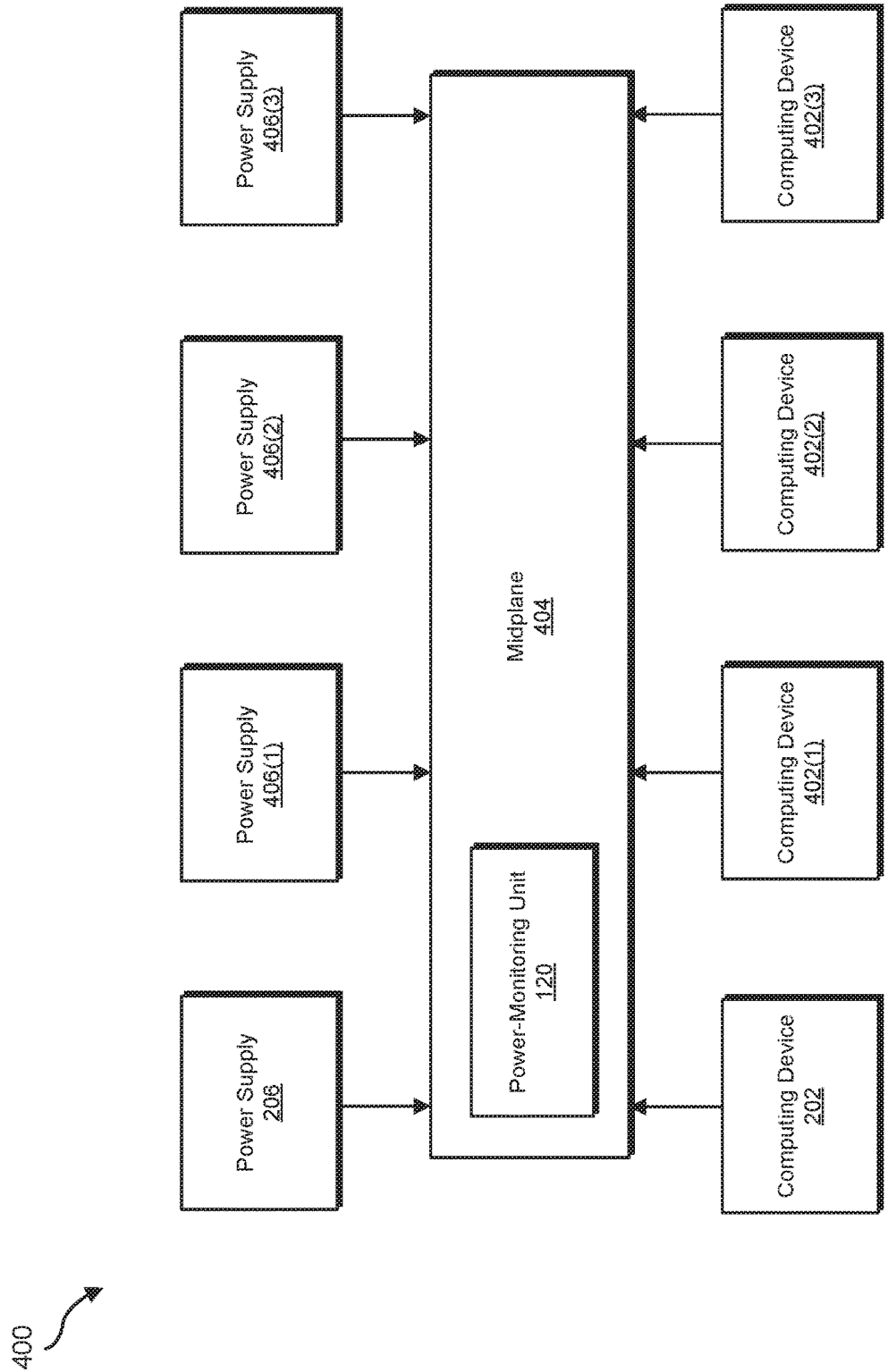
FIG. 4 is a block diagram of an exemplary implementation for detecting electrical failures within computing devices.

FIG. 4 illustrates an exemplary implementation 400 of power-monitoring module 120 within a midplane 404. In this example midplane 404 may receive power from power supply 206 and one or more additional power supplies, such as power supplies 406(1-3). Midplane 404 may distribute this power to computing device 202 and one or more other computing devices, such as computing devices 402(1-3). In implementation 400, power-monitoring unit 120 may measure the total amount of power input to midplane 404 by power supply 206 and power supplies 406(1-3). Power-monitoring unit 120 may also measure the total amount of power output to computing device 202 and computing devices 402(1-3) from midplane 404.

Figure 5:
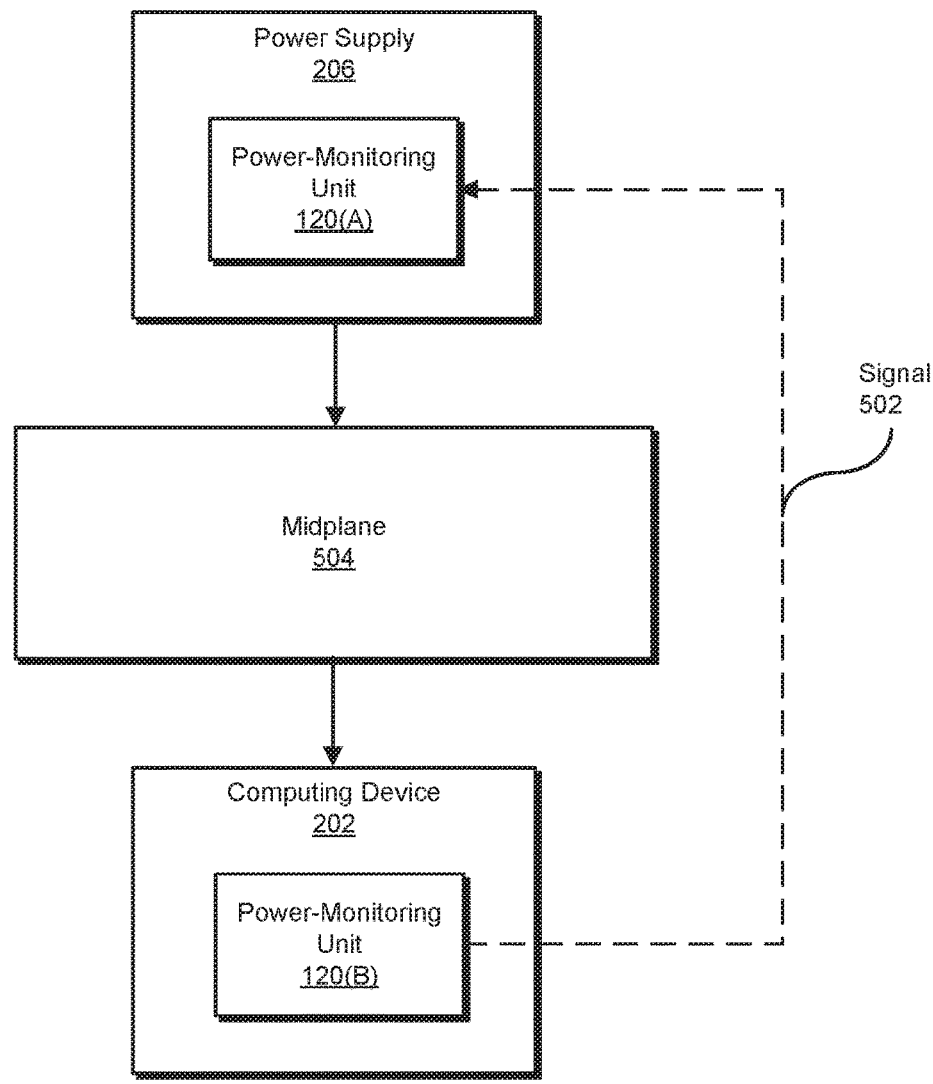
FIG. 5 is a block diagram of an additional exemplary implementation for detecting electrical failures within computing devices.

FIG. 5 illustrates an additional exemplary implementation 500 of power-monitoring unit 120. In this example, a power-monitoring unit 120(A) (including all or a portion of modules 102) may be implemented within power supply 206. Similarly, a power-monitoring unit 120(B) (also including all or a portion of modules 102) may be implemented within computing device 202. As shown in FIG. 5, power supply 206 and computing device 202 may be connected to a midplane 504. Midplane 504 may receive power from and/or distribute power to any additional power supply and/or computing device not illustrated in FIG. 5.

In implementation 500, power-monitoring unit 120(A) may monitor power consumed by computing device 202 based on signals sent by power-monitoring unit 120(B). For example, power-monitoring unit 120(B) may periodically send a signal 502 (e.g., any type or form of wired or wireless communication) to power-monitoring unit 120(A) that indicates the amount of power currently consumed by computing device 202. Specifically, when the amount of power consumed by computing device 202 is within a certain range associated with normal and/or safe operation of computing device 202, power-monitoring unit 120(B) may periodically (e.g., every 5 minutes) send signal 502 to power-monitoring unit 120(A) to indicate computing device 202 is operating normally. In some examples, power-monitoring unit 120(A) may periodically and/or continuously attempt to detect these signals from power-monitoring unit 120(A).

Implementation 400 of power-monitoring unit 120 and implementation 500 of power-monitoring unit 120 may be executed either independently or concurrently with respect to one another. For example, because implementation 400 may operate within the midplane of a power-supply system and implementation 500 may operate predominantly within an external power supply of a power-supply system, these implementations may detect different types of electrical failures. As an example, implementation 500 may be designed to and/or capable of detecting short circuits within computing device 202 and/or midplane 404 even if the short circuits have damaged certain software operating within computing device 202 and/or midplane 404. Thus, while implementation 400 and implementation 500 may operate individually and/or independently, incorporating both implementation 400 and implementation 500 into a single power-supply system may improve and/or maximize the detection of electrical failures within the power-supply system.

Returning to FIG. 3, at step 320 one or more of the systems described herein may detect that the amount of power provided to the computing device exceeds the amount of power consumed by the computing device by at least a certain threshold. For example, detection module 106 may, as part of power-monitoring unit 120 in FIG. 2, detect that the amount of power provided to computing device 202 exceeds the amount of power consumed by the computing device by at least a threshold 208. In this example, power-monitoring unit 120 may be implemented within and/or as part of computing device 202, power supply 206, and/or any additional device connected to computing device 202 and/or power supply 206.

Threshold 208 generally refers to and/or indicates any amount or portion of power that is provided to a computing device but not consumed by the computing device during a short circuit or other malfunction. For example, while a short circuit within a device may increase the amount of power flowing between two or more nodes involved in the short circuit, the overall amount of power consumed by the device may decrease. Accordingly, threshold 208 may indicate, represent, and/or amount to an expected drop in overall power consumption by computing device 202 due to a short circuit or similar failure.

In some embodiments, threshold 208 may represent a quantity of power, such as 400 Watts. In other embodiments, threshold 208 may represent a percentage or relative portion of power. For example, the amount of power provided to computing device 202 may exceed, by threshold 208, the amount of power consumed by computing device 202 if the amount of consumed power is less than 75% of the amount of provided power. In this example, if the amount of provided power is 1 kilowatt, this provided power may exceed the amount of consumed power by threshold 208 in the event that the amount of consumed power is less than 750 Watts.

Furthermore, in some examples, detection module 106 may adjust threshold 208 based on one or more testing conditions and/or variables that monitoring module 104 recorded while measuring the amount of power consumed by and provided to computing device 202. For example, detection module 106 may increase threshold 208 in response to determining that a large number (e.g., 10 or more) of computing devices were connected to a midplane while monitoring module 104 monitored the input and output power of the midplane.

The systems described herein may perform step 320 in a variety of ways and/or contexts. In the event that computing device 202 and power supply 206 are connected to a midplane, detection module 106 may determine whether the total amount of power provided by all or a portion of the power supplies connected to the midplane exceeds the total amount of power consumed by all or a portion of the computing devices connected to the midplane by threshold 208. For example, in implementation 400, power-monitoring unit 120 within midplane 404 may detect that the total amount of power provided by power supply 206 and power supplies 406(1-3) to midplane 404 exceeds the total amount of power output to computing device 202 and computing devices 402(1-3) from midplane 404 by threshold 208.

As described above, in some examples, monitoring module 104 may monitor the amount of power consumed by computing device 202 based on signals received from computing device 202 that indicate computing device 202 is operating with a normal and/or expected range of power. In these examples, detection module 106 may determine that the amount of power provided to computing device 202 exceeds the amount of power consumed by computing device 202 by at least threshold 208 based on detecting a failure to receive such a signal within a certain amount of time.

For example, in implementation 500, power-monitoring unit 120(A) within power supply 206 may direct and/or program a counter (e.g., a timer) to count from an initial value to a final value during a certain length of time. As an example, power-monitoring unit 120(A) may implement a counter that counts from 0 to 300 over the course of 5 minutes. In this example, power-monitoring unit 120(A) may determine whether power-monitoring unit 120(B) sends signal 502 while the counter is counting.

In the event that power-monitoring unit 120(A) fails to detect signal 502 while the counter is counting, power-monitoring unit 120(A) may determine that the current amount of power provided to computing device 202 exceeds the amount of power consumed by computing device 202 by threshold 208. For example, power-monitoring unit 120(A) may infer, based on the failure to receive signal 502, that computing device 202 is not operating within a normal range of power. In contrast, power-monitoring unit 120(A) may determine that computing device 202 is operating within a normal range of power in the event that power-monitoring unit 120(A) receives signal 502 while the counter is counting.

In implementation 500, power-monitoring unit 120(A) may direct the counter to reset (e.g., begin counting from the initial value) in response to receiving signal 502. For example, power-monitoring unit 120(B) may direct the counter to continuously cycle from the initial value to the final value as long as signal 502 is received at some point during each cycle of the counter. In some examples, power-monitoring unit 120(A) may direct power supply 206 to provide power to computing device 202 while the counter is counting. In addition, as will be explained in greater detail below, power-monitoring unit 120(A) may direct power supply 206 to stop supplying power to computing device 202 while the counter is not counting.

Returning to FIG. 3, at step 330 one or more of the systems described herein may determine, based at least in part on the amount of power provided to the computing device exceeding the amount of power consumed by the computing device by the certain threshold, that the computing device is experiencing a malfunction. For example, determination module 108 may, as part of power-monitoring unit 120 in FIG. 2, determine that computing device 202 is experiencing malfunction 122 based at least in part on the amount of power provided to computing device 202 exceeding the amount of power consumed by computing device 202 by threshold 208. In this example, power-monitoring unit 120 may be implemented within and/or as part of computing device 202, power supply 206, and/or any additional device connected to computing device 202 and/or power supply 206.

The systems described herein may perform step 330 in a variety of ways and/or contexts. In implementation 400, power-monitoring unit 120 within midplane 404 may determine that at least one computing device connected to midplane 404 is experiencing malfunction 122 based on the amount of power provided to midplane 404 exceeding the amount of power output from midplane 404 by threshold 208.

In implementation 500, power-monitoring unit 120(A) within power supply 206 may determine that computing device 202 is experiencing malfunction 122 based at least in part on detecting a failure to receive signal 502 while the counter within power-monitoring unit 120(A) was counting. For example, power-monitoring unit 120(A) may infer that malfunction 122 damaged all or a portion of computing device 202 (including power-monitoring unit 120(3)), thereby rendering power-monitoring unit 120(B) incapable of sending signals to power-monitoring unit 120(A). In some examples, in response to determining that computing device 202 has not sent signal 502 by the time the counter reaches its final value, power-monitoring unit 120(A) may direct the counter within power-monitoring unit 120(A) to stop counting.

In some embodiments, determination module 108 may perform one or more actions to confirm the presence of malfunction 122 within computing device 202. For example, determination module 108 may direct monitoring module 104 to obtain one or more updated (e.g., current) measurements of the amount of power consumed by computing device 202 and the amount of power provided to computing device 202. In other words, monitoring module 104 may repeat the initial power-monitoring test that was performed on computing device 202. In some embodiments, monitoring module 104 may ensure that the conditions and/or settings of computing device 202 and power supply 206 during this subsequent test are the same as or similar to the conditions under which the initial test was conducted.

After monitoring module 104 obtains updated measurements of the amount of power consumed by and provided to computing device 202, detection module 106 may evaluate these updated measurements. Detection module 106 may evaluate the updated measurements based on threshold 208 and/or any additional threshold. In one embodiment, this additional threshold may be greater than threshold 208 (e.g., 450 Watts instead of 400 Watts). In the event that determination module 108 determines that the updated amount of power provided to computing device 202 exceeds the updated amount of power consumed by computing device 202 by at least the threshold implemented by detection module 106, determination module 108 may confirm (e.g., with a higher degree of confidence) that computing device 202 is experiencing malfunction 122.

Returning to FIG. 3, at step 340 one or more of the systems described herein may mitigate potential damage to the computing device due to the malfunction by at least partially reducing the amount of power provided to the computing device from the external power supply. For example, reducing module 110 may, as part of power-monitoring unit 120 in FIG. 2, mitigate potential damage to computing device 202 due to malfunction 122 by at least partially reducing the amount of power provided to computing device 202 from power supply 206. In this example, power-monitoring unit 120 may be implemented within and/or as part of computing device 202, power supply 206, and/or any additional device connected to computing device 202 and/or power supply 206.

The systems described herein may perform step 340 in a variety of ways and/or contexts. In some examples, reducing module 110 may prevent any power from being provided to computing device 202 in response to malfunction 122. For example, reducing module 110 may physically and/or electrically decouple computing device 202 from power supply 206. In another example, reducing module 110 may execute a software-based command that directs power supply 206 to stop providing power to computing device 202 (as well as any other computing device connected to power supply 206). In other examples, reducing module 110 may direct power supply 206 to provide a limited and/or controlled amount of power to computing device 202 such that computing device 202 remains at least partially operational but further damage to computing device 202 is prevented.

In implementation 400, power-monitoring unit 120 within midplane 404 may prevent power distributed to midplane 404 from being passed to computing device 202 until malfunction 122 is resolved. In some examples power-monitoring unit 120 may prevent power from being passed to each additional computing device connected to midplane 404. For example, power-monitoring unit 120 may direct each power supply connected to midplane 404 to stop providing power to midplane 404.

In implementation 500, power-monitoring unit 120(A) within power supply 206 may prevent power supply 206 from providing power to computing device 202 via midplane 504. Power-monitoring unit 120(A) may also direct any additional power supply connected to midplane 504 to stop providing power to midplane 504. In some examples, power-monitoring unit 120(A) may prevent power supply 206 from providing power to computing device 202 in response to determining that the counter within power-monitoring unit 120(A) has stopped counting. For example, power-monitoring unit 120(A) may bind and/or associate the counter with the output of power supply 206 such that power supply 206 automatically turns off and/or becomes inactive when the counter is stopped.

Figure 6:
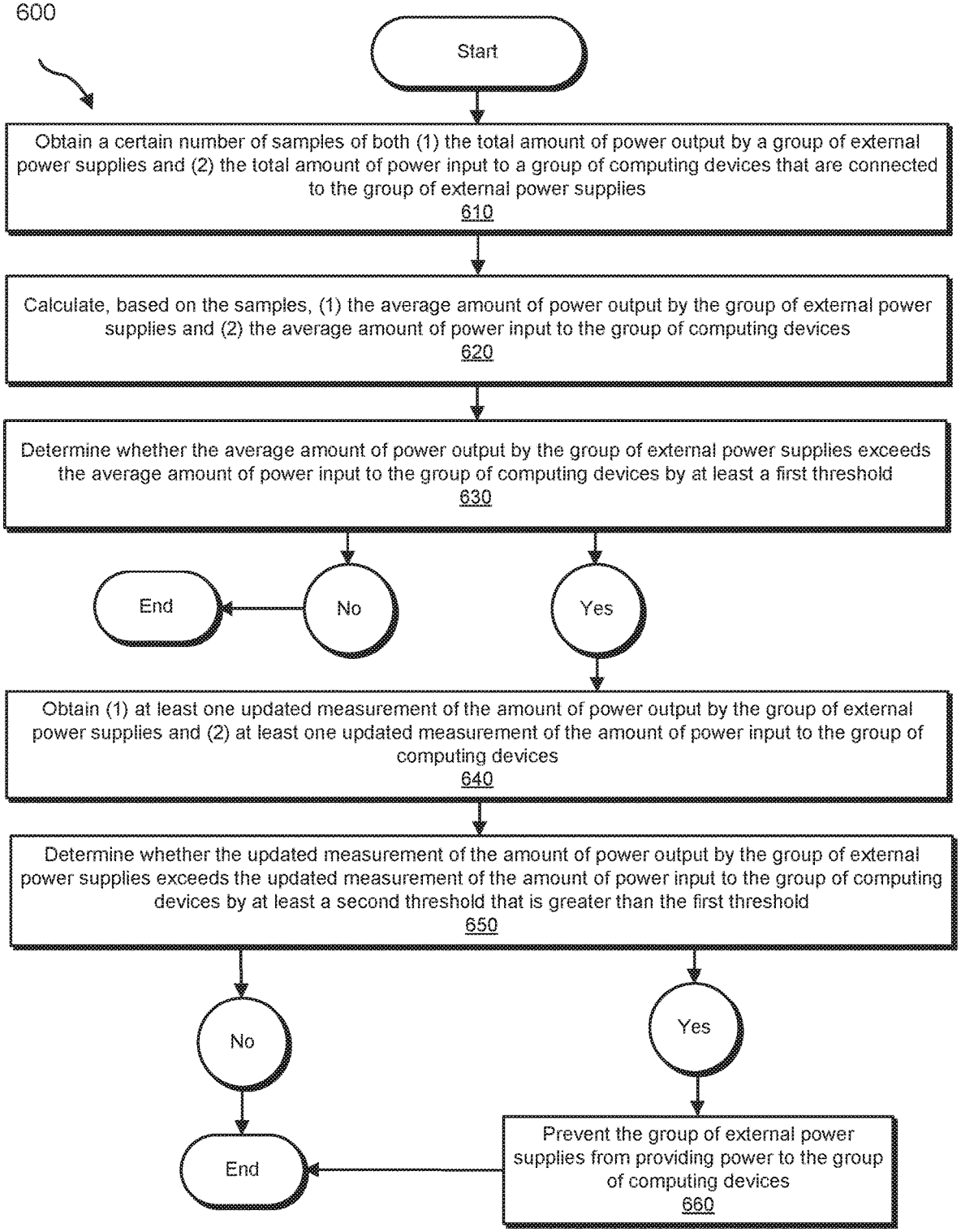
FIG. 6 is a flow diagram of an additional exemplary method for detecting electrical failures within computing devices.

FIG. 6 is a flow diagram of an exemplary method 600 for detecting electrical failures within computing devices. Method 600 may correspond to and/or describe an exemplary embodiment of implementation 400. Thus, in some examples, method 600 may be performed by an instance of power-monitoring unit 120 implemented within a midplane that connects one or more external power supplies with one or more of computing devices.

At step 610 of method 600, power-monitoring unit 120 may obtain a certain number of samples of both (1) the total amount of power output by a group of external power supplies and (2) the total amount of power input to a group of computing devices that are connected to the group of external power supplies. At step 620, power-monitoring unit 120 may calculate, based on the samples, (1) the average amount of power output by the group of external power supplies and (2) the average amount of power input to the group of computing devices.

At step 630, power-monitoring unit 120 may determine whether the average amount of power output by the group of external power supplies exceeds the average amount of power input to the group of computing devices by at least a first threshold. In the event that power-monitoring unit 120 determines the average amount of power output by the group of external power supplies does not exceed the average amount of power input to the group of computing devices by the first threshold, method 600 may end. For example, power-monitoring unit 120 may determine that the amount of power consumed by the group of computing devices is within a normal or expected range and, therefore, none of the computing devices are experiencing a malfunction (such as a short circuit). However, in the event power-monitoring unit 120 determines the average amount of power output by the group of external power supplies does exceed the average amount of power input to the group of computing devices by the first threshold, method 600 may proceed to step 640.

At step 640, power-monitoring unit 120 may obtain (1) at least one updated measurement of the amount of power output by the group of external power supplies and (2) at least one updated measurement of the amount of power input to the group of computing devices. Next, at step 650, power-monitoring unit 120 may determine whether the updated measurement of the amount of power output by the group of external power supplies exceeds the updated measurement of the amount of power input to the group of computing devices by at least a second threshold that is greater than the first threshold. In other words, power-monitoring unit 120 may perform a second power-monitoring test to confirm that at least one of the computing devices is experiencing a malfunction.

In the event that power-monitoring unit 120 determines that the updated measurement of the amount of power output by the group of external power supplies does not exceed the updated measurement of the amount of power input to the group of computing devices by the second threshold, method 600 may end. For example, power-monitoring unit 120 may determine that the initially-detected malfunction was a false alarm. In the event that power-monitoring unit 120 determines that the updated measurement of the amount of power output by the group of external power supplies does exceed the updated measurement of the amount of power input to the group of computing devices by the second threshold, method 600 may proceed to step 660.

At step 660, power-monitoring unit 120 may prevent the group of external power supplies from providing power to the group of computing devices. For example, power-monitoring unit 120 may direct each external power supply to turn off and/or become inactive such that power no longer flows within the computing devices. In this way, power-monitoring unit 120 may prevent further damage to the computing devices due to the malfunction.

Figure 7:
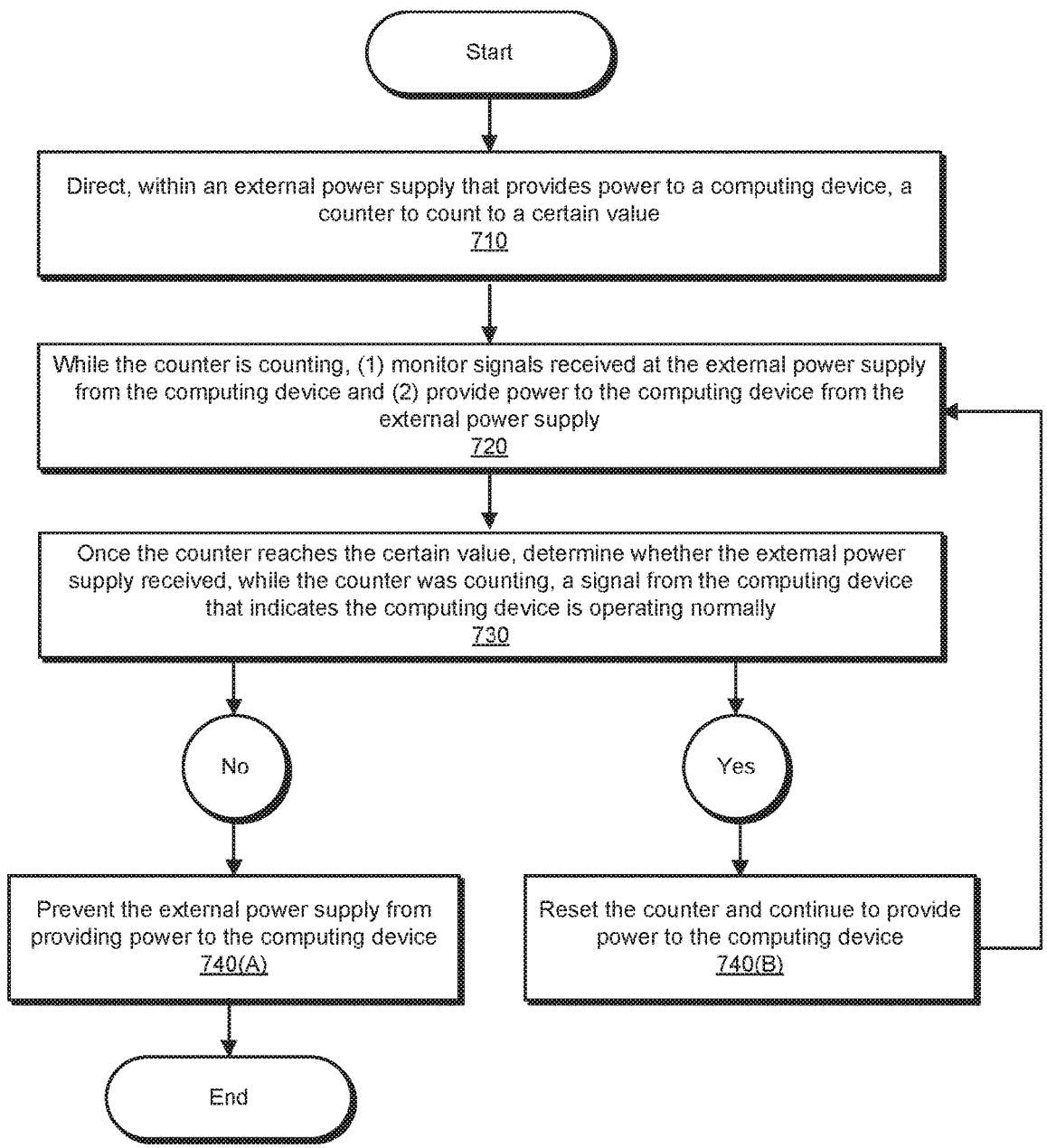
FIG. 7 is a flow diagram of an additional exemplary method for detecting electrical failures within computing devices.

FIG. 7 is a flow diagram of an exemplary method 700 for detecting electrical failures within computing devices. Method 700 may correspond to and/or describe an exemplary embodiment of implementation 500. Thus, in some examples, method 700 may be at least partially performed by an instance of power-monitoring unit 120 implemented within an external power supply that provides power to a computing device.

At step 710 of method 700, power-monitoring unit 120 may direct, within an external power supply that provides power to a computing device, a counter to count to a certain value. At step 720, power-monitoring unit 120 may (1) monitor signals received at the external power supply from the computing device and (2) provide power to the computing device from the external power supply. In some embodiments, step 720 may be performed while the counter is counting.

Once the counter reaches the certain value, method 700 may proceed to step 730. At step 730, power-monitoring unit 120 may determine whether the external power supply received, while the counter was counting a signal from the computing device that indicates the computing device is operating normally.

In the event that the external power pply did not receive the signal power-monitoring unit 120 may determine that the computing device is experiencing a malfunction. Method 700 may then proceed to step 740(A). At step 740(A), power-monitoring unit 120 may prevent the external power supply from providing power to the computing device. For example, power-monitoring unit 120 may direct the external power supply to turn off and/or become inactive such that power no longer flows within the computing device, thereby preventing further damage to the computing device due to the malfunction.

In the event that the external power supply received the signal at step 730, power-monitoring unit 120 may determine that the computing device is not experiencing a malfunction. Method 700 may then proceed to step 740(B). At step 740(B), power-monitoring unit 120 may reset the counter and continue to provide power to the computing device. Method 700 may then return to step 720. In this way, the counter may continue to cycle (and the external power supply may continue to provide power to the computing device) while the power consumption of the computing device is within a normal range.

Figure 8:
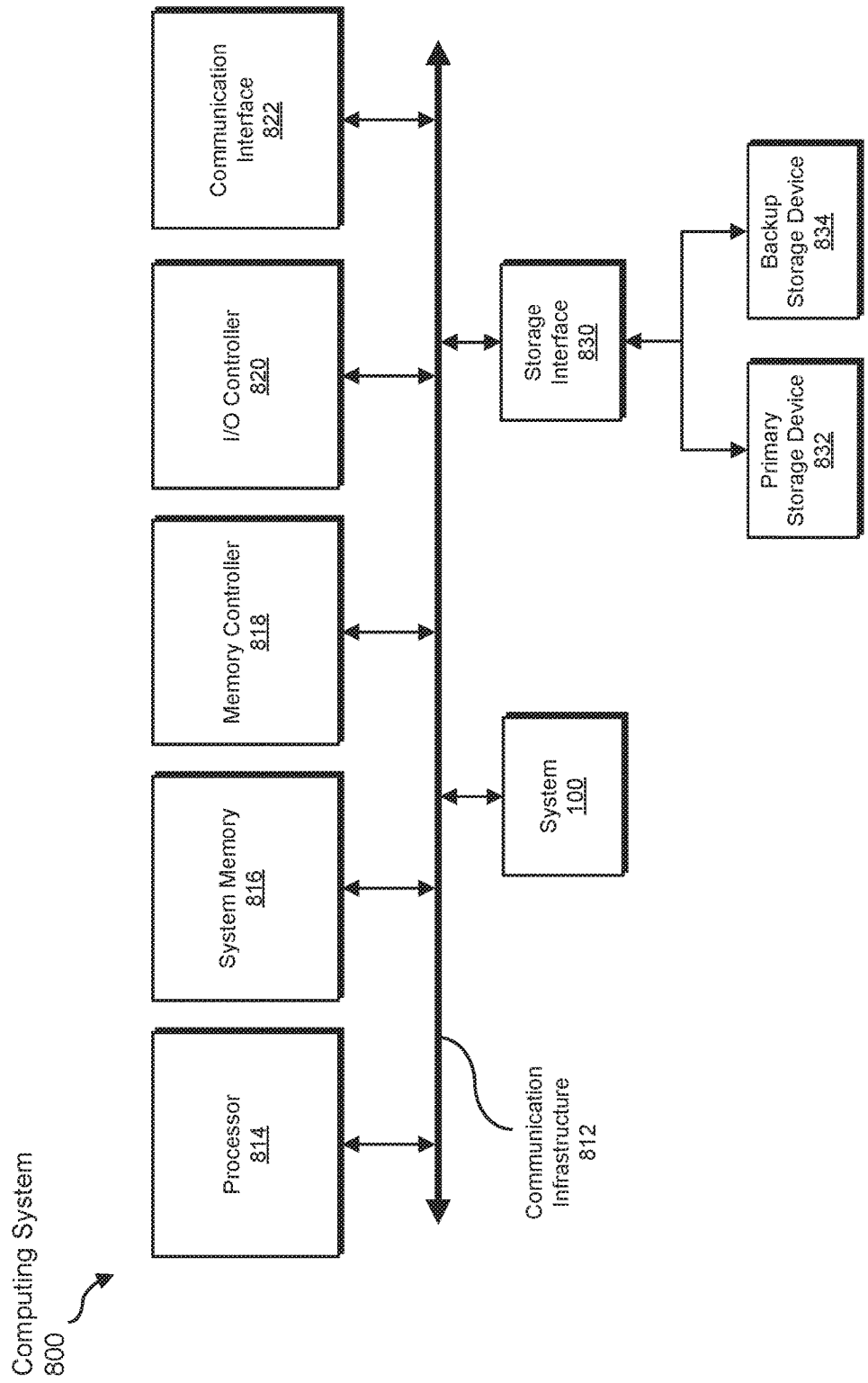
FIG. 8 is a block diagram of an exemplary computing system capable of implementing and/or being used in connection with one or more of the embodiments described and/or illustrated herein.

FIG. 8 is a block diagram of an exemplary computing system 800 capable of implementing and/or being used in connection with one or more of the embodiments described and/or illustrated herein. In some embodiments, all or a portion of computing system 800 may perform and/or be a means for performing, either alone or in combination with other elements, one or more of the steps described in connection with FIGS. 3, 6, and/or 7. All or a portion of computing system 800 may also perform and/or be a means for performing and/or implementing any other steps, methods, or processes described and/or illustrated herein.

Computing system 800 broadly represents any type or form of electrical load, including a single or multi-processor computing device or system capable of executing computer-readable instructions. Examples of computing system 800 include, without limitation, workstations, laptops, client-side terminals, servers, distributed computing systems, mobile devices, network switches, network routers (e.g., backbone routers, edge routers, core routers, mobile service routers, broadband routers, etc.), network appliances (e.g., network security appliances, network control appliances, network timing appliances, SSL VPN (Secure Sockets Layer Virtual Private Network) appliances, etc.), network controllers, gateways (e.g., service gateways, mobile packet gateways, multi-access gateways, security gateways, etc.), and/or any other type or form of computing system or device.

Computing system 800 may be programmed, configured, and/or otherwise designed to comply with one or more networking protocols. According to certain embodiments, computing system 800 may be designed to work with protocols of one or more layers of the Open Systems Interconnection (OSI) reference model, such as a physical layer protocol, a link layer protocol, a network layer protocol, a transport layer protocol, a session layer protocol, a presentation layer protocol, and/or an application layer protocol. For example, computing system 800 may include a network device configured according to a Universal Serial Bus (USB) protocol, an Institute of Electrical and Electronics Engineers (IEEE) 1394 protocol, an Ethernet protocol, a T1 protocol, a Synchronous Optical Networking (SONET) protocol, a Synchronous Digital Hierarchy (SDH) protocol, an Integrated Services Digital Network (ISDN) protocol, an Asynchronous Transfer Mode (ATM) protocol, a Point-to-Point Protocol (PPP), a Point-to-Point Protocol over Ethernet (PPPoE), a Point-to-Point Protocol over ATM (PPPoA), a Bluetooth protocol, an IEEE 802.XX protocol, a frame relay protocol, a token ring protocol, a spanning tree protocol and/or any other suitable protocol.

Computing system 800 may include various network and/or computing components. For example, computing system 800 may include at least one processor 814 and a system memory 816. Processor 814 generally represents any type or form of processing unit capable of processing data or interpreting and executing instructions. For example, processor 814 may represent an application-specific integrated circuit (ASIC), a system on a chip (e.g., a network processor), a hardware accelerator, a general purpose processor, and/or any other suitable processing element.

Processor 814 may process data according to one or more of the networking protocols discussed above. For example, processor 814 may execute or implement a portion of a protocol stack, may process packets, may perform memory operations (e.g., queuing packets for later processing), may execute end-user applications, and/or may perform any other processing tasks.

System memory 816 generally represents any type or form of volatile or non-volatile storage device or medium capable of storing data and/or other computer-readable instructions. Examples of system memory 816 include without limitation, Random Access Memory (RAM), Read Only Memory (ROM), flash memory, or any other suitable memory device. Although not required, in certain embodiments computing system 800 may include both a volatile memory unit (such as, for example, system memory 816) and a non-volatile storage device (such as, for example, primary storage device 832, as described in detail below). System memory 816 may be implemented as shared memory and/or distributed memory in a network device. Furthermore, system memory 816 may store packets and/or other information used in networking operations.

In certain embodiments exemplary computing system 800 may also include one or more components or elements in addition to processor 814 and system memory 816. For example, as illustrated in FIG. 8, computing system 800 may include a memory controller 818, an Input/Output (I/O) controller 820, and a communication interface 822, each of which may be interconnected via communication infrastructure 812. Communication infrastructure 812 generally represents any type or form of infrastructure capable of facilitating communication between one or more components of a computing device. Examples of communication infrastructure 812 include, without limitation, a communication bus (such as a Serial ATA (SATA), an Industry Standard Architecture (ISA), a Peripheral Component Interconnect (PCI), a PCI Express (PCIe), and/or any other suitable bus), and a network.

Memory controller 818 generally represents any type or form of device capable of handling memory or data or controlling communication between one or more components of computing system 800. For example, in certain embodiments memory controller 818 may control communication between processor 814, system memory 816, and I/O controller 820 via communication infrastructure 812. In some embodiments, memory controller 818 may include a Direct Memory Access (DMA) unit that may transfer data (e.g., packets) to or from a link adapter.

I/O controller 820 generally represents any type or form of device or module capable of coordinating and/or controlling the input and output functions of a computing device. For example, in certain embodiments I/O controller 820 may control or facilitate transfer of data between one or more elements of computing system 800, such as processor 814, system memory 816, communication interface 822, and storage interface 830.

Communication interface 822 broadly represents any type or form of communication device or adapter capable of facilitating communication between exemplary computing system 800 and one or more additional devices. For example, in certain embodiments communication interface 822 may facilitate communication between computing system 800 and a private or public network including additional computing systems. Examples of communication interface 822 include, without limitation, a link adapter, a wired network interface (such as a network interface card), a wireless network interface (such as a wireless network interface card), and any other suitable interface. In at least one embodiment, communication interface 822 may provide a direct connection to a remote server via a direct link to a network, such as the Internet. Communication interface 822 may also indirectly provide such a connection through, for example, a local area network (such as an Ethernet network), a personal area network, a wide area network, a private network (e.g., a virtual private network), a telephone or cable network, a cellular telephone connection, a satellite data connection, or any other suitable connection.

In certain embodiments, communication interface 822 may also represent a host adapter configured to facilitate communication between computing system 800 and one or more additional network or storage devices via an external bus or communications channel. Examples of host adapters include, without limitation, Small Computer System Interface (SCSI) host adapters, Universal Serial Bus (USB) host adapters, IEEE 1394 host adapters, Advanced Technology Attachment (ATA), Parallel ATA (DATA), Serial ATA (SATA), and External SATA (eSATA) host adapters, Fibre Channel interface adapters, Ethernet adapters, or the like. Communication interface 822 may also enable computing system 800 to engage in distributed or remote computing. For example, communication interface 822 may receive instructions from a remote device or send instructions to a remote device for execution.

As illustrated in FIG. 8, exemplary computing system 800 may also include a primary storage device 832 and/or a backup storage device 834 coupled to communication infrastructure 812 via a storage interface 830. Storage devices 832 and 834 generally represent any type or form of storage device or medium capable of storing data and/or other computer-readable instructions. For example, storage devices 832 and 834 may represent a magnetic disk drive (e.g., a so-called hard drive), a solid state drive, a floppy disk drive, a magnetic tape drive, an optical disk drive, a flash drive, or the like. Storage interface 830 generally represents any type or form of interface or device for transferring data between storage devices 832 and 834 and other components of computing system 800.

In certain embodiments, storage devices 832 and 834 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 832 and 834 may also include other similar structures or devices for allowing computer software, data, or other computer-readable instructions to be loaded into computing system 800. For example storage devices 832 and 834 may be configured to read and write software, data, or other computer-readable information. Storage devices 832 and 834 may be a part of computing system 800 or may be separate devices accessed through other interface systems.

Many other devices or subsystems may be connected to computing system 800. Conversely, all of the components and devices illustrated in FIG. 8 need not be present to practice the embodiments described and/or illustrated herein. The devices and subsystems referenced above may also be interconnected in different ways from those shown in FIG. 8. Computing system 800 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable medium. The term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and other distribution systems.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of system 100 in FIG. 1 may represent portions of a cloud-computing or network-based environment. Cloud-computing and network-based environments may provide various services and applications via the Internet. These cloud-computing and network-based services (e.g., software as a service, platform as a service, infrastructure as a service, etc.) may be accessible through a web browser or other remote interface. Various functions described herein may also provide network switching capabilities, gateway access capabilities, network security functions, content caching and delivery services for a network, network control services, and/or and other networking functionality.

In addition, one or more of the modules described herein may transform data, physical devices, and/or representations of physical devices from one form to another. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
monitoring, while a computing device receives power from an external power supply:
the amount of power consumed by the computing device; and
the amount of power provided to the computing device by the external power supply;
detecting that the amount of power provided to the computing device exceeds the amount of power consumed by the computing device by at least a certain threshold;
determining, based at least in part on the amount of power provided to the computing device exceeding the amount of power consumed by the computing device by the certain threshold, that the computing device is experiencing a malfunction; and
mitigating potential damage to the computing device due to the malfunction by at least partially reducing the amount of power provided to the computing device from the external power supply.

2. The method of claim 1, further comprising connecting both the external power supply and the computing device to a midplane that:
receives power from a plurality of external power supplies; and
distributes the received power to a plurality of computing devices.

3. The method of claim 2, wherein:
monitoring the amount of power consumed by the computing device comprises monitoring, by a power-monitoring unit within the midplane, the amount of power consumed by the plurality of computing devices;
monitoring the amount of power provided to the computing device by the external power supply comprises monitoring, by the power-monitoring unit, the amount of power provided to the midplane by the plurality of external power supplies; and
determining that the amount of power provided to the computing device exceeds the amount of power consumed by the computing device by the certain threshold comprises determining, by the power-monitoring unit, that the amount of power provided to the midplane exceeds the amount of power consumed by the plurality of computing devices by the certain threshold.

4. The method of claim 1, wherein detecting that the amount of power provided to the computing device exceeds the amount of power consumed by the computing device by the certain threshold comprises determining that the average amount of power provided to the computing device within a period of time exceeds the average amount of power consumed by the computing device within the period of time by the certain threshold.

5. The method of claim 1, wherein monitoring the amount of power consumed by the computing device comprises:
periodically determining, at the computing device, whether the current amount of power consumed by the computing device is within a certain range corresponding to normal operation of the computing device; and
following each determination that the current amount of power consumed by the computing device is within the certain range, sending a signal confirming that the computing device is operating normally to a power-monitoring unit within the external power supply.

6. The method of claim 5, wherein:
monitoring the amount of power consumed by the computing device further comprises:
receiving, at the power-monitoring unit within the external power supply, an initial signal from the computing device that confirms the computing device is operating normally; and
determining, at the power-monitoring unit, whether the computing device sends a subsequent signal that confirms the computing device is operating normally within a certain amount of time following receipt of the initial signal; and
detecting that the computing device is experiencing the malfunction comprises determining, at the power-monitoring unit, that the computing device fails to send the subsequent signal within the certain amount of time.

7. The method of claim 6, wherein determining whether the computing device sends the subsequent signal within the certain amount of time comprises:
directing, within the power-monitoring unit, a counter to count from an initial value to a final value during the certain amount of time; and
monitoring signals received from the computing device while the counter is counting from the initial value to the final value.

8. The method of claim 7, further comprising:
determining, based on the monitored signals received from the computing device, that the subsequent signal was received while the counter was counting from the initial value to the final value; and
in response to determining that the subsequent signal was received, resetting the counter such that the counter begins counting from the initial value.

9. The method of claim 7, further comprising:
determining, based on the monitored signals received from the computing device, that the subsequent signal was not received while the counter was counting from the initial value to the final value; and
in response to determining that the subsequent signal was not received, directing the counter to stop counting.

10. The method of claim 9, further comprising:
directing the external power supply to provide power to the computing device while the counter is counting; and
directing the external power supply to prevent power from being provided to the computing device while the counter is not counting.

11. The method of claim 1, further comprising confirming that the computing device is experiencing the malfunction by:

obtaining, in response to determining that the amount of power provided to the computing device exceeds the amount of power consumed by the computing device by the certain threshold:
an additional measurement of the amount of power provided to the computing device; and
an additional measurement of the amount of power consumed by the computing device; and
determining that the additional measurement of the amount of power provided to the computing device exceeds the additional measurement of the amount of power consumed by the computing device by at least an additional threshold that is greater than the certain threshold.

12. A system comprising:
a monitoring module, stored in memory, that monitors, while a computing device receives power from an external power supply:
the amount of power consumed by the computing device; and
the amount of power provided to the computing device by the external power supply;
a detection module, stored in memory, that detects that the amount of power provided to the computing device exceeds the amount of power consumed by the computing device by at least a certain threshold;
a determination module, stored in memory, that determines, based at least in part on the amount of power provided to the computing device exceeding the amount of power consumed by the computing device by the certain threshold, that the computing device is experiencing a malfunction;
a reducing module, stored in memory, that mitigates potential damage to the computing device due to the malfunction by at least partially reducing the amount of power provided to the computing device from the external power supply; and
at least one physical processor configured to execute the monitoring module, the detection module, the determination module, and the reducing module.

13. The system of claim 12, wherein the monitoring module further connects both the external power supply and the computing device to a midplane that:
receives power from a plurality of external power supplies; and
distributes the received power to a plurality of computing devices.

14. The system of claim 13, wherein:
the monitoring module monitors, by a power-monitoring unit within the midplane, the amount of power consumed by the plurality of computing devices;
the monitoring module monitors, by the power-monitoring unit, the amount of power provided to the midplane by the plurality of external power supplies; and
the determination module determines that the computing device is experiencing the malfunction based on the amount of power provided to the midplane exceeding the amount of power consumed by the plurality of computing devices by the certain threshold.

15. The system of claim 12, wherein the detection module determines that the average amount of power provided to the computing device within a period of time exceeds the average amount of power consumed by the computing device within the period of time by the certain threshold.

16. The system of claim 12, wherein the monitoring module:
periodically determines, at the computing device, whether the current amount of power consumed by the computing device is within a certain range corresponding to normal operation of the computing device; and
following each determination that the current amount of power consumed by the computing device is within the certain range, sends a signal confirming that the computing device is operating normally to a power-monitoring unit within the external power supply.

17. The system of claim 16, wherein the detection module:
receives, at the power-monitoring unit within the external power supply, an initial signal from the computing device that confirms the computing device is operating normally;
determines, at the power-monitoring unit, whether the computing device sends a subsequent signal that confirms the computing device is operating normally within a certain amount of time following receipt of the initial signal; and
detects that the computing device is experiencing the malfunction by determining, at the power-monitoring unit, that the computing device fails to send the subsequent signal within the certain amount of time.

18. The system of claim 17, wherein the monitoring module determines whether the computing device sends the subsequent signal within the certain amount of time by:
directing, within the power-monitoring unit, a counter to count from an initial value to a final value during the certain amount of time; and
monitoring signals received from the computing device while the counter is counting from the initial value to the final value.

19. The system of claim 18, wherein the monitoring module further:
determines, based on the monitored signals received from the computing device, that the subsequent signal was received while the counter was counting from the initial value to the final value; and
in response to determining that the subsequent signal was received, resets the counter such that the counter begins counting from the initial value.

20. A power-monitoring apparatus comprising:
at least one storage device that facilitates execution of the power-monitoring apparatus; and
at least one physical processing device communicatively coupled to the storage device, wherein the physical processing device:
monitors, while a computing device receives power from an external power supply:
the amount of power consumed by the computing device; and
the amount of power provided to the computing device by the external power supply;
detects that the amount of power provided to the computing device exceeds the amount of power consumed by the computing device by at least a certain threshold;
determines, based at least in part on the amount of power provided to the computing device exceeding the amount of power consumed by the computing device by the certain threshold, that the computing device is experiencing a malfunction; and
mitigates potential damage to the computing device due to the malfunction by at least partially reducing the amount of power provided to the computing device from the external power supply.

\* \* \* \* \*